United States Patent [19]

Hensel et al.

[11] Patent Number: 5,022,978
[45] Date of Patent: Jun. 11, 1991

[54] APPARATUS FOR COATING THREE DIMENSIONAL SUBSTRATES BY MEANS OF CATHODE SPRUTTERING

[75] Inventors: Bernd Hensel, Frankfurt; Uwe Kopacz, Hainburg; Dieter Hofmann, Bruchköbel; Hans Schüssler, Schiffweiler; Gunter Eckhardt, Hanau, all of Fed. Rep. of Germany

[73] Assignee: Leybold Aktiengesellschaft, Hanau, Fed. Rep. of Germany

[21] Appl. No.: 548,299

[22] Filed: Jul. 5, 1990

[30] Foreign Application Priority Data

Mar. 22, 1990 [DE] Fed. Rep. of Germany ....... 4009151

[51] Int. Cl.$^5$ .............................................. C23C 19/34
[52] U.S. Cl. ........................... 204/298.19; 204/298.14; 204/298.28; 204/192.12
[58] Field of Search ...................... 204/298.06, 298.14, 204/298.16, 298.19, 298.23, 298.26, 298.27, 298.28, 298.29, 192.12

[56] References Cited

U.S. PATENT DOCUMENTS 4,013,532  3/1977  Cormia et al. .............. 204/298.28 X
4,392,931  7/1983  Maniv et al. ................ 204/298.28 X
4,525,262  6/1985  Class et al. .................. 204/298.28 X
4,798,663  1/1989  Herklotz et al. ........... 204/298.16 X Primary Examiner—Nam X. Nguyen
Attorney, Agent, or Firm—Felfe & Lynch

[57] ABSTRACT

A device for coating substrates has a rectangular magnetron cathode 2 with a target, a substrate holder 16 that can be rotated around a rotating axis 17 which is parallel to the longitudinal edges of the target, a planar wall 20 made of a non-magnetic material and having longitudinal edges 21, 22 also parallel to the rotating axis 17. Behind the wall there is a magnet arrangement and the magnetron cathode 2 and the wall 20 are disposed on opposite sides of the rotating axis. The device further includes a planar anode. In order to intensify and the effect of the plasma and render it more uniform, the distance on the substrate path between the longitudinal edges 12, 13 of the target and the longitudinal edges 21, 22 of the wall parallel thereto is reduced by at least one additional wall 25, 26 with a magnet arrangement 27, 28 disposed therebehind. Further, the poles of all the magnet arrangements 23, 27, 28 alternate on the circumference of the substrate holder 16 such that the entire circumference of the substrate holder is surrounded by an uninterrupted series of magnetic tunnels.

6 Claims, 5 Drawing Sheets

APPARATUS FOR COATING THREE DIMENSIONAL SUBSTRATES BY MEANS OF CATHODE SPRUTTERING

BACKGROUND OF THE INVENTION

The invention relates to a device for coating substrates by means of cathode sputtering and comprises a. a rectangular magnetron cathode which is provided with a target with longitudinal edges and defines a coating region, b. a substrate holder which can be rotated around a rotating axis that is parallel to the longitudinal edges, the substrates having surface elements which can be moved across the coating region on a circular path, c. a planar wall which has longitudinal edges and is made of a non-magnetic material, the edges also running parallel to the rotating axis of the substrate holder. A magnet arrangement for the generation of a longitudinally extended magnetic tunnel is disposed behind the wall. This tunnel extends across the surface of wall which faces the substrate. The magnetron cathode and the wall are on opposite sides of the rotating axis. The longitudinal sides of the magnetic tunnel also run parallel to the longitudinal edges of the target, and d. a planar anode.

The substrates in question are in particular, but not exclusively, those of large dimensions and/or complicated three-dimensional shapes. With conventional devices which have at least one magnetron cathode, it is difficult to coat such substrates uniformly and an all around. Further, it is also difficult to uniformly etch and clean all planar elements prior to the coating. This procedure requires a uniform ion bombardment covering the entire surface.

Using magnetron cathodes, there two requirements which diametrically oppose one another: One the one hand, the magnetron sputtering cathode is characterized by a very particular association between a magnet system and the target which consists of the coating material or at least one component of the coating material, a so called high-performance coating source, i.e. a coating source with a high sputtering rate per surface unit. On the other hand, the plasma and/or the glow discharge is kept away from the substrates by the magnetic field unless other measures of a partly very complex nature are taken. This will be discussed in further detail hereinafter. The interaction between magnetic field and target is also referred to as "magnetic trap."

The properties of a high-performance sputtering process are, as a matter of fact, accomplished by the high concentration of the plasma on the substrate surface. This very fact is the cause for the small spatial expansion of the plasma which opposes the requirement "to bathe" the substrates in the plasma.

Magnetron sputtering cathodes are largely known. For an example, refer to U.S. Pat. No. 4,166,018 which discloses a so-called "planar magnetron."

A magnetron cathode of this kind is not necessarily suitable for the all around coating of three-dimensional substrates, especially, when the substrate is allowed to execute complex composite movements which are made possible by a multi-axial spatial movement of a substrate holder.

From U.S. Pat. No. 4,426,267 it is known to coat three-dimensional substrates all around by passing the substrates across a space formed between two mirror-invertedly opposed magnetron cathodes without a rotational movement. The geometry of the entire arrangement, the design of the magnetron cathode and the operating parameters including a negative bias-voltage at the substrates must be selected such that all sides of the substrate are exposed to the plasma. This measurement proved to be extremely favorable for a substrate size which is prescribed by a distance of the target surfaces of approximately 120 mm. One must take into account that even protruding parts of the substrates have to have a minimum distance from the target surface so that the largest dimension of the substrate in direction of normal of the target surface is limited to a maximum of 30 to 40 mm.

U.S. Pat. No. 4,798,663, discloses apparatus having elements (a.) to (d.) described above. For one particular purpose (coating of so called hard material), it discloses measures and means which permit all sides of three-dimensional substrates to be coated with an adhesive layers of hard material. On the one hand, this is made possible by rotating the substrate, on the other hand, by the bombardment with additional electrons into the coating region of the magnetron cathode. The device is therefore provided with an additional arrangement of electron emitters and counter electrodes which generate an additional flow of electrons. In this arrangement, the substrates are exposed to an additional temperature stress caused by the radiation of the emitters. Temperatures of 200° C. which are harmful to certain materials, for example steel, are already exceeded after a short while. In this piece of prior art, the plasma is spatially very limited. The substrates hence periodically pass through the plasma and plasma-free zones with the largest partial circumference of the substrate paths being outside the plasma zone. In this known device, the maximum size of the substrates also has relatively narrow limits.

With reference to a magnetron cathode, it is also known to increase the spatial expansion of the plasma by operating the magnetron cathode in a condition which can be referred to as unbalanced with respect to the magnet system. Due to differently sized pole surfaces of the magnet systems and/or additional magnetic coils, a substantial portion of the magnetic flux lines does no longer return to the target surface on relatively short arc like paths but it extends far out into the space up to the counter electrode. The latter is usually configured as a substrate holder and holds the substrate. Because of their effect, magnetron cathodes of this kind are also referred to a "Unbalanced Magnetrons." Examples of such systems are described by B. Window and N. Savvides:

1. "Charged particle fluxes from planar magnetron sputtering sources"
   J. Vac. Sci. Technol. A 4 (2) March/April 1986, pages 196 to 202 and
2. "Unbalanced" dc magnetrons and sources of high ion fluxes"
   J. Vac. Sci. technol. A 4 (3), May/June 1986, pages 453 to 456.

These systems permit a high average substrate current density, however, they fail to provide a sufficiently uniform effect of the plasma on the substrate, particularly during etching and/or cleaning.

In addition to a high density, another important requirement to be met for the successful use of a hard material layer is a sufficient adherence between the substrate and the coating. For this purpose, it is necessary that the substrate material be removed from the entire surface of the component part during the etching or cleaning procedure. In case of a geometrically complicated, large component part, it is crucial that the uniform removal be accomplished solely under the use of a high negative voltage on the substrate. If, however, high negative substrate potentials are applied to the substrate at a pressure of some $10^{-2}$ mbar (argon), only very low current densities of below 0.2 mA/cm$^2$ substrate surface can be used for the ion bombardment at the substrate during the etching procedure.

The resulting low removal rates lead, on the one hand, to a increased removal of material on the planar elements which are located at the surface and, hence, are easily accessible. On the other hand, there is an excessive etching at the edges. No material or only little material is removed from the covered internal surfaces of the part so that the adherence is already impaired at these locations.

Moreover, it was observed that the relatively high process pressures required for the etching cause a redeposition of removed material from the region of exposed surface parts to those surface parts where there is no or only little etching. Large portions of the substrate surface are thus not subject to any etching.

SUMMARY OF THE INVENTION

It is hence an object of the invention to improve a device of the aforesaid kind insofar that even substrates of large cross sectional dimensions and irregular shapes can optionally be etched (cleaned) with great uniformity and that they can be coated with layers, which exhibit a great adhesiveness. "Cross sectional dimensions" of the substrates refers to the maximum distance between two locations within the individual cross sectional planes. The latter run perpendicular to the target surface and to the rotating axis of the substrate holder. They hence determine the minimally possible distance of the rotating axis of the substrate holder from the target surface.

The object is accomplished with the aforesaid device in accordance with the invention in that e. the distance between the longitudinal edges of the target and the longitudinal edges of the wall parallel thereto is reduced on the circumference of the substrate paths by at least one additional wall with a magnet arrangement disposed therebehind. The at least one additional magnet arrangement is aligned with the first magnet arrangement at an angle and in that f. the poles of all magnet arrangements alternate on the circumference of the substrate holder such that the entire circumference of the substrate holder is surrounded by an uninterrupted series of magnetic tunnels.

The importance of constructional regulations according to the features e. and f. will later be explained based on the comparison with prior art. First, it is essential that the substrate paths run in their entirety inside the plasma. This is achieved in that the substrate paths are surrounded by an uninterrupted series of magnetic tunnels.

When making use of the accomplishment in accordance with the invention, it is possible to generate, during etching, current densities on the substrate which clearly exceed 1 mA/cm$^2$ substrate surface while employing a pressure of $1.8 \times 10^{-2}$ mbar (argon), a substrate potential of $-1750$ volts and an anode potential of $+40$ volts.

All surface elements of the substrates are thus subject to the etching procedure. Even those elements which are located on internal surfaces, for example, the internal surfaces of ring bearings.

During the coating of these substrates at a pressure of $6 \times 10^{-3}$ bar (argon), a cathode potential of $-550$ volts and a substrate potential of $-60$ volts, current density values were achieved which, in dependency upon the strength of the magnetic field at the target, ranged between 1.0 and 1.5 mA/cm$^2$. The layers so obtained were distinguished by an excellent adherence to the substrate, a low friction coefficient and a low wear abrasion under testing methods described in further detail hereinafter.

It is of advantage when the walls of the magnet system are located in a polygonal enveloping surface which encloses at least the partial circumference of the substrate path that is not in line of sight with the magnetron cathode.

DETAILED DESCRIPTION OF THE PREFERRED EMBODIMENT

Figure 1:
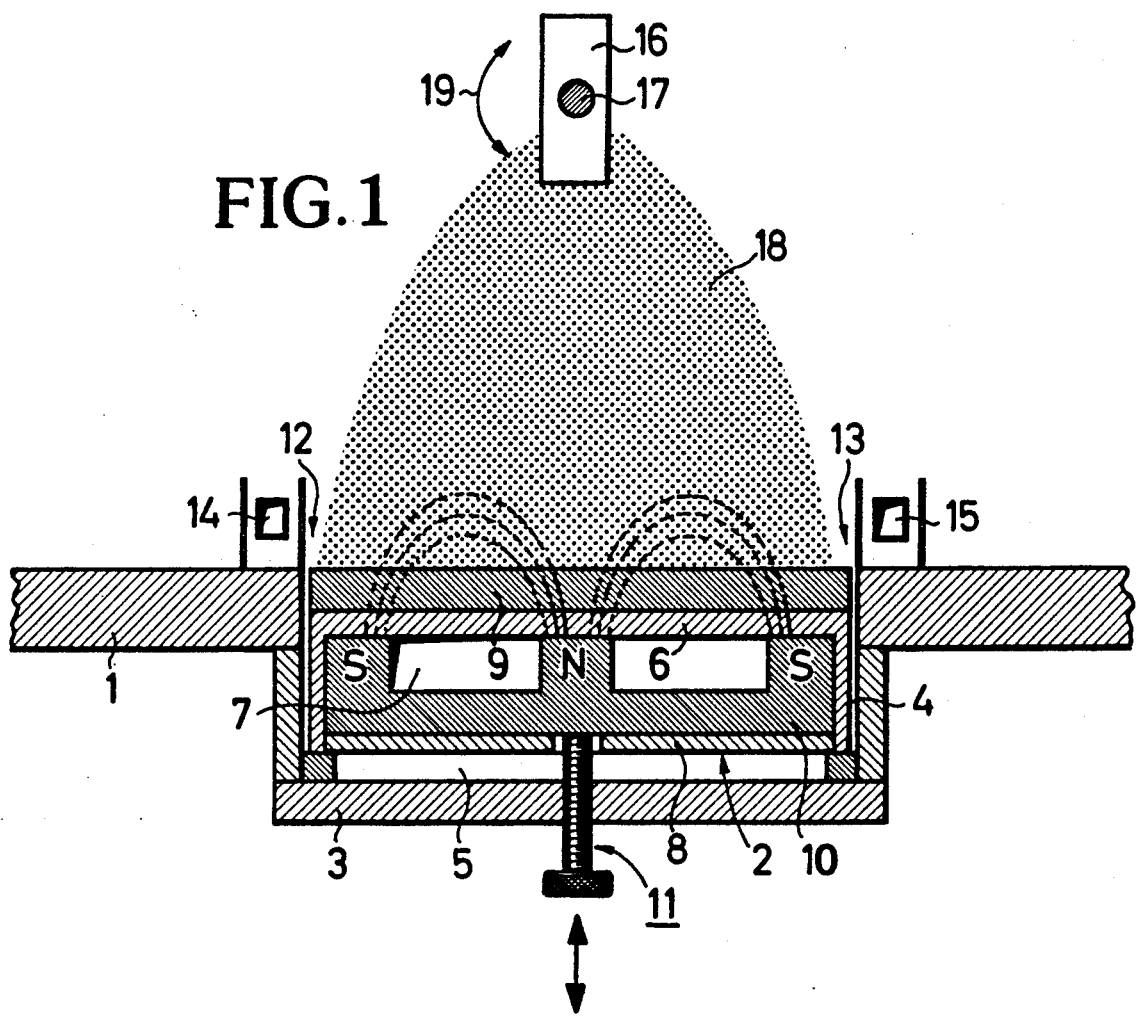
FIG. 1 is an arrangement of substrate holder and magnetron cathode according to prior art.

FIG. 1 shows a unilaterally acting device according to prior art. A conventional magnetron cathode 2 is included in the wall of a vacuum chamber 1. For this purpose, the vacuum chamber is provided with a block-like, hollow partial housing 3 which surrounds the magnetron cathode 2 at such short a distance that glow discharges cannot be produced in the so formed gaps 4 and 5.

The magnetron cathode 2 is a so called rectangular cathode where the main direction of extension (longest axis) runs parallel to the plane of projection. The magnetron cathode 2 includes a trough-like basic body 6 with a hollow space 7 which is closed by a cover 8. On the front side of the basic body, there is a plate-like target 9 in a good thermally conductive connection. This target consists of the coating material or at least a component of the coating material.

In the hollow space 7, there is a magnet system 10 which forms a closed tunnel of magnetic flux lines. In the projection toward the target 9, this tunnel has the form of a "race track." The magnet system includes a center row of permanent magnets in a linear arrangement. This row runs in direction of the longitudinal axis of the magnetron cathode. This row faces the target 9 with its north pole "N." In direct vicinity of the frame of the basic body 6, there is an uninterrupted series of additional permanent magnets which is closed on its circumference. The poles are in opposite direction, i.e. in this case, the south pole "S" faces the target 9.

As seen in FIG. 1, the outer series of permanent magnets in the form of a rectangle surrounds the inner, bar-like series of permanent magnets at a distance. The opposing sides of the permanent magnets are joined by a yoke plate which is not referenced. Further information on the design of the magnetron cathode may be omitted here, since cathodes of this kind are state-of-the-art. Also state-of-the-art is an adjusting device 11 for the magnet system 10 which includes a threaded spindle and serves to adjust the distance between the pole surfaces of the permanent magnets and the front side of the basic body. The adjusting device serves to compensate effects of the target material while the latter is increasingly consumed.

Figure 3:
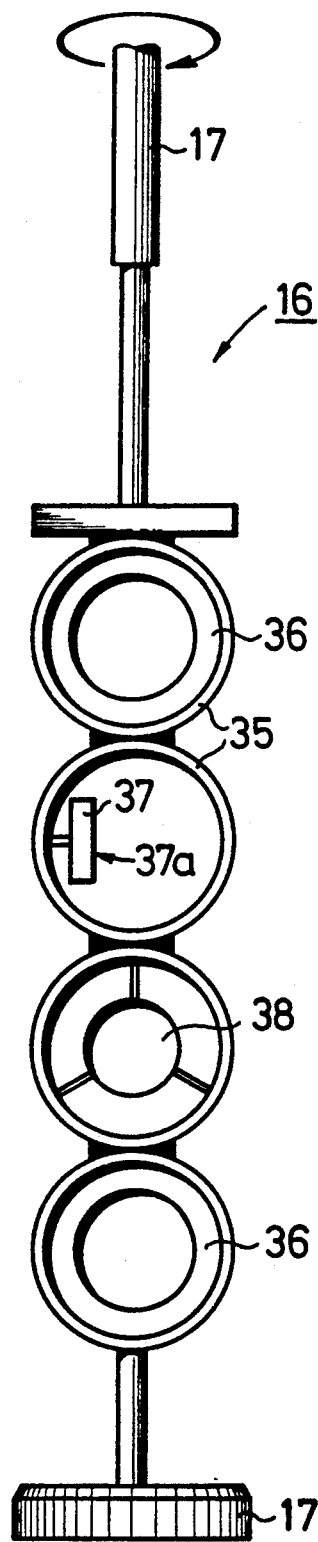
FIG. 3 is a typical arrangement of substrates (ring bearings) on a rotatable substrate holder.

The target 9 has two straight longitudinal edges 12 and 13 which also run perpendicular to the plane of projection. Parallel to these longitudinal edges, there are two gas distributing systems 14 and 15 which are used to supply reactive gases, like nitrogen, for example, to the sputtering process when chromium nitride, from a target 9 made of chromium, is to be deposited on a substrate. In FIG. 1, a substrate holder 16 is shown as a rectangle. It has a rotating axis 17 which runs parallel to the plane of projection and hence parallel to the longitudinal edges 12 and 13 and also parallel to the gas distributing systems 14 and 15. It is possible, for example, that ring bearings be disposed on this rotating axis as it is represented in FIG. 3.

Due to a corresponding design of the magnet system 10 in conjunction with a corresponding selection of the operating parameters inclusive of a sufficient bias voltage at the substrate holder 16, it is possible that the plasma—represented as dots in FIG. 1—extends to the substrate holder 16. However, it is not possible to extend the plasma 18 in the same way to the rear side of the substrate holder facing away from the target 9. An all around coating can only be applied when the substrate holder 16 and the substrate are continuously rotated in direction of arrow 19. Those surface elements of the substrate on the partial circumference of the substrate path which face away from the target 9 are withdrawn, temporarily that is, from the effect of the plasma.

In such a device, the average substrate current is below 0.5 mA/cm$^2$ even when all other process parameters are optimized. The consequences were explained in the introductory part of the description. It is understood that the rotating axis 17 is in the longest symmetrical plane of the magnetron cathode 2 and is spaced apart from the target surface at a distance that had to be empirically determined.

Figure 2:
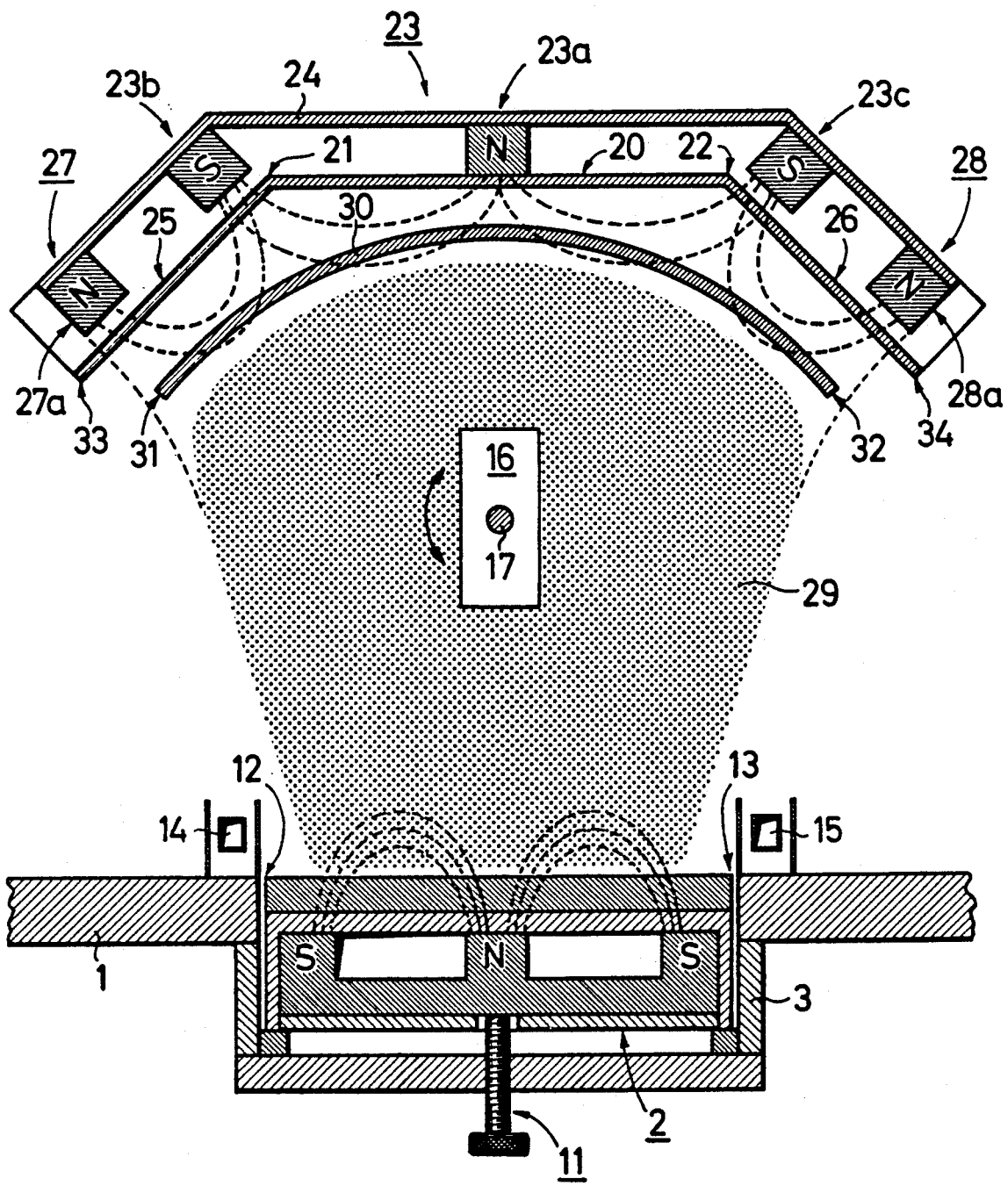
FIG. 2 is an arrangement according to the invention including several magnet arrangements and a curved planar anode.

The magnetron cathode 2 of FIG. 2, inclusive of its accommodation in the partial housing 3, is identical with the one of FIG. 1.

The subject-matter of FIG. 2 is distinct from the arrangement of FIG. 1 in that it is additionally provided with a flat wall 20 made of a non-magnetic material. This wall is disposed on the side of the substrate holder 16 which faces away from the target 9 and has longitudinal edges 21 and 22 which also run parallel to the rotating axis 17 of the substrate holder 16. Another magnet arrangement 23 which includes a central bar of permanent magnets 23a and two flanking outer bars of permanent magnets 23b and 23c is disposed behind this wall. The position of the poles of the outer permanent magnets 23b and 23c is opposite to the one of the center permanent magnets 23a. The magnetic flux lines thus run in an arc-like path from the center row of permanent magnets 23a toward the two outer rows of permanent magnets 23b and 23c. This is indicated by dotted lines. On the one side which faces away from the wall 20, the permanent magnets 23a, 23b and 23c are magnetically connected by means of a yoke plate 24. It is not of essential significance that the two outer rows of permanent magnets 23b, 23c are located slightly outside the longitudinal edges 21 and 22 since the flat wall 20 is continued on both sides of the longitudinal edges 21 and 22 by further walls 25 and 26 made of a non-magnetic material. The latter walls each form an obtuse angle of 135 degrees with the wall 20, for example, with respect to the target 9. Up to the longitudinal edges 21 and 22, the device of FIG. 2 inclusive of the row arrangement of permanent magnets 23a, 23b is prior art (U.S. Pat. No. 4,798,663), however, without emitter). In distinction to prior art, however, there are two directly joined additional walls 25 and 26. Another magnet arrangement 27 and 28 is provided therebehind on each side and associated with a straight row of permanent magnets 27a and 28a, respectively. It is understood that in order to achieve the desired effect, the magnet arrangement 27 is associated with the row of permanent magnets 23b and the magnet arrangement 28 is associated with the row of permanent magnets 23c. Moreover, the poles of the permanent magnets 27a and 28a are opposite to those of the permanent magnets 23b and 23c such that arc-like running magnetic flux lines form between these poles.

It is obvious that the walls 25 and 26 and the additional magnet arrangements 27 and 28 significantly reduce the distance to the longitudinal edges 12 and 13 of the target 9, if looked at in circumferential direction of the rotating axis 17. Moreover, as regards the position of the poles of the magnet system 10 and the one of the permanent magnets 27a and 28a, these poles were disposed such that the closest poles are opposite to one another. In the represented embodiment, the free pole surfaces of the permanent magnets 27a and 28a are configured as north poles and the free pole surfaces of the outer permanent magnets of the magnet system 10 are configured as south poles. Consequently, the magnetic flux lines run from the pole surfaces of the permanent magnets 27a and 28a toward the respectively closest pole surfaces of the magnet system 10 of the magnetron cathode 2.

This resulting constellation is such that on the circumference of the rotating axis 17 of the substrate holder 16 the poles of all magnet arrangements 23, 27 and 28 including the poles of the magnet system 10 of the magnetron cathode alternate. The so created course of the magnetic flux lines causes the plasma 29 to extend over a significantly larger volume and, in particular, the substrate holder 16 is completely surrounded which then leads to the above described advantages.

The walls of 20, 25 and 26 are located on the shorter sides of a trapezoid and hence enclose a trapezoidal hollow space open toward the magnetron cathode 2. This hollow space contains an anode 30 which forms a sector of a thin-walled hollow cylinder. The longitudinal edges 31 and 32 of this anode 30 are in the vicinity of the outer longitudinal edges 33 and 34 of the walls 25 and 26. This anode naturally also serves to form the plasma 29. The plasma 29 is necessarily spaced-apart from the anode 30 since the latter constitutes a source for the electrons which maintain the process. The ionization probability in direct vicinity of the anode 30 is thus significantly reduced and the known dark field is also produced.

It is of importance that all possible surface elements of the substrate holder 16 and/or the substrates move on substrate paths which are inside plasma 29. This device is therefore significantly distinct from the one of FIG. 1.

Further, it must be emphasized that the magnetron cathode 2, the gas distributing systems 14 and 15, the walls 20, 25 and 26, the rows of permanent magnets and the anode 30—if looked at perpendicular to the plane of projection—have essentially the same length as the substrate holder 16 and the rotating axis 17 thereof. The latter is generally of a perpendicular configuration so that said substrate paths run in horizontal planes.

The following explanations relate to the cross sectional dimension —in the plane of projection of FIG. 2—of the walls 20, 25, and 26 and the anode 30: The distance of the longitudinal edges 21 and 22, produced by correspondingly bending plates made of a non-magnetic material, corresponds at least approximately to the width of the target 9, i.e. the distance between the longitudinal edges 12 and 13. The distances between the longitudinal edges 21 and 33, on the one side, and 22 and 34, on the other side, correspond at least to half the distance which the longitudinal edges 21 and 22 have to one another. The arc length of the anode 30 between the longitudinal edges 31 and 32 can be determined by optimizing experiments. Experiments showed that when the arc length is changed, an optimal condition is reached when the substrate current density has reached a maximum possible value.

For dimensioning purposes, a diagram of the substrate current density is outlined over the arc length of the anode. If the arc length is changed from a narrow sheet metal strip of approximately 2 cm to a value where the anode surrounds the rotating axis at almost half the circumference and if the values for the substrate current density are entered in the diagram, two maximum values are produced at both ends of the curve. The one maximum value corresponds to a configuration which corresponds to the one of FIG. 2 almost true to scale, i.e. the anode surrounds the rotating axis 17 at a circumference of approximately 120 degrees. In this case, the device can be universally used for both small and large substrates.

FIG. 3 shows a substrate holder 16 with four support rings 35 to hold substrates 36. The latter are configured as ring bearings and have an external diameter of 65 mm and an axial length of approximately 25 mm. The support rings 35 are welded to one another and attached to the rotating axis 17 in the linear manner as shown. The rotating axis is part of substrate holder 16. Details regarding the attachment and the rotating drive are omitted for reasons of simplicity. The ring bearings are to be etched and coated on their internal surfaces.

In the one support ring 35 there is at one side a sample substrate 37 which is 30 mm in diameter and has a thickness of 5 mm, and the front surface 37 a runs parallel to the ring planes. Another support ring 35 has a further sample substrate in its center, the two front surfaces of which run parallel to the ring planes. These sample substrates are used to examine the representative product properties since the internal surfaces of the ring bearings are not easily accessible to conventional testing devices.

Experiment 1

(Comparative Example)

A system type Z 700 P2/2 of Leybold Aktiengesellschaft was equipped with a magnetron cathode type PK 500 L with the target 9 being made of chromium. The substrate holder and the substrates corresponded to the arrangement of FIG. 3. The gas distributing systems 14 and 15 optionally permitted the supply of pure argon (for etching) or a mixture of argon and nitrogen (for the deposition of chromium nitride layers). The system was first equipped in accordance with FIG. 1. The substrate holder and the walls of the vacuum chamber assumed the function of the anode.

The substrate material was 100Cr6 which can sustain temperatures up to 200° C., at a maximum.

For the etching purification, a process pressure of $1.8 \times 10^{-2}$ mbar was generated by introducing pure argon. $-1750$ V were applied to the substrate. The magnetron cathode 2 was operated at a potential of $-280$ V at a cathode current of 0.7 A. A maximum substrate current of 80 mA was obtained. The time characteristics of this current, however, exhibited distinct changes in the substrate current. A reduction of up to 50% could be observed. These current fluctuations were caused by the fact that the substrates, depending on the angle position relative to the magnetron cathode 2, were immersed in the plasma to a varying extent and then again withdrawn from it. Therefore, it was obvious that an etching was only produced on those surface areas of the substrate which were in a particularly suitable location.

Figure 4:
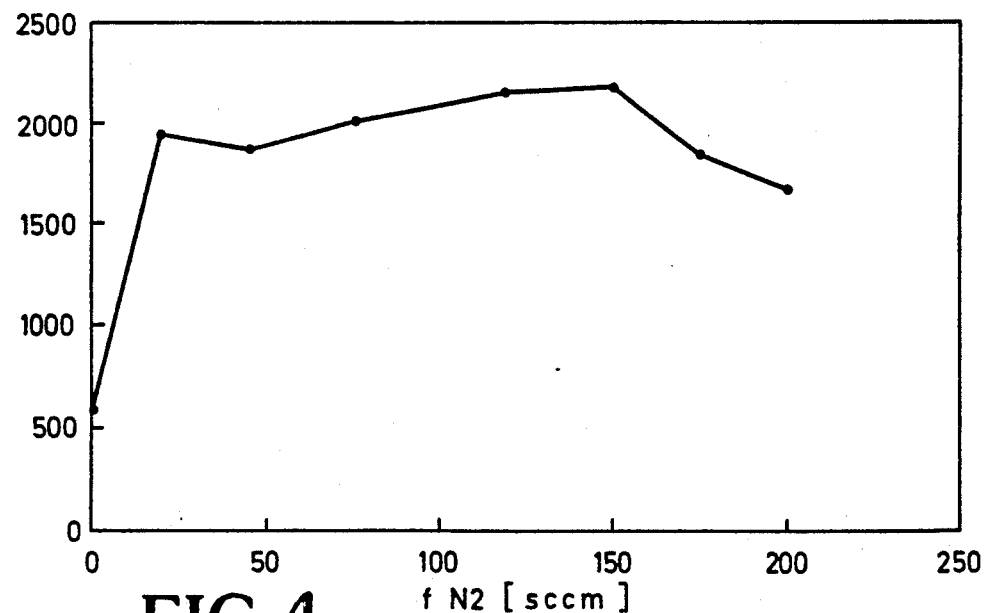
FIG. 4 is a diagram illustrating the dependency of the microhardness $HV_{0.01}$ of the nitrogen flow supplied to the device.

Upon completion of the etching purification, the potentials of substrate holder and magnetron cathode were changed. To carry out the coating, the cathode was operated at a potential of $-560$ V, the cathode current being at 7.2 A. 27 sccm nitrogen were added to the argon flow. FIG. 4 illustrates the dependency of the micro hardness $HV_{0.01}$ in dependency upon this nitrogen flow. Obviously, a substantial increase of this nitrogen flow does not improve the micro hardness although this nitrogen flow, which is considered low, was accompanied by an understoichiometric coating of $CrN_x$. The conditions as described were expected to lead to a good adherence of the hard material which still has a largely metallic character.

So coated sample substrates were subsequently tested in a so-called "tribometer". The coating was one single layer of 2.0 $\mu$m $CrN_x$.

The tribometer was a "Pin-on-Disc machine" type SIN manufactured by the firm of CSEM in CH-2000 Neuchatel 7/Switzerland. The counter body was a hard metal sphere with a bearing load of 2.5 N. The relative speed was 0.6 m/min, the temperature was room temperature, and the relative humidity was at 30%. The following values were measured: the friction coefficient was at $\mu = 0.8$, hence relatively high, and a prescribed path of 50 m to be covered by the hard metal sphere on the layer could not be achieved since the layer had peeled off at the contact spot prior thereto. For a better understanding of "path" note the following: the hard metal sphere was gliding around the center of a discoidal sample substrate following a circular path with a radius of 8 mm so that the resulting circle was covered many times. The experiment failed by far to reach the goal which was set at approximately 1,100 complete revolutions.

Further tests with a scratch tester type A 150 Scratch-Test also manufactured by CSEM lead to clearly visible scratches on the coating. On both sides of the scratches, long portions of the layer surface had come off. A penetration test according to "Rockwell" with a manual hardness tester manufactured by Fritschi in D-8500 Nürnberg 40 resulted not only in a clearly visible impression on the testing sphere but also in the formation of radial cracks in the coating within an annular zone. The average diameter of the latter was about 2 to 3-fold the diameter of the impression of the testing sphere.

EXAMPLE 2

(Comparative Example)

In order to improve these properties, the substrates were provided with an intermediate layer of pure chromium of a thickness of 0.5 μm between the etching procedure and the coating with $CrN_X$. The nitrogen was therefore introduced only after the intermediate layer had reached the necessary thickness. The remaining process parameter during the etching and the coating with the $CrN_X$, were not changed. In the tribometer test, however, the layer sequence of substrate-chromium-$CrN_X$ showed the same poor properties: The layer peeled off after only a few meters of covered distance and showed clearly visible scratch marks. Also, in the Rockwell test, the aforesaid radially extending cracks were visible inside the annular zone around the impression of the sphere.

EXAMPLE 3

(Comparative Example)

Attempts were made to prolong the etching times under otherwise identical operating conditions. The goal was values twice as long. But even prolonged etching times did not improve the adhesive strength of the coating. Moreover, an additional disadvantage is caused by the loss of hardness of the basic material (material 100Cr6) already after the etching.

Evaluation of the comparative examples 1 to 3

When using a device according to FIG. 1, even very long etching times and/or the use of elevated temperature during the etching could not ensure a sufficiently reliable removal of the surface impurities by means of ion etching.

During coating this device allowed only a maximum current density at the substrate which was below 0.5 mA/cm² of the substrate surface. Such low current densities obviously cause layers to be deposited which had no optimal growth or a low density. In particular, this means that an increase of the speed of movement of the condensing particles was not possible to a sufficient extent, so that a high density of the condensed coating material could consequently not be achieved. This was in particular evidenced by the fact that the layers in question exhibited a column-like microstructure with gaping, irregular surfaces.

This short, column-like microstructure creates unfavorable conditions regarding friction properties and wear when the layers are used for technical components, tools and, of course, jewelry.

EXAMPLE 4

By including the walls 20, 25 and 26 with the magnet arrangements 23, 27 and 28 as well as including the anode 30 in the device of FIG. 1, the latter was now upgraded such that it corresponded to the one in FIG. 2.

During the ion etching, an argon pressure of $1.8 \times 10^{-2}$ mbar, a substrate potential of $-1750$ V, and an anode potential of $+40$ V was selected. The resulting current densities at the substrates clearly exceeded 1 mA/cm² of substrate surface. A clearly visible etching at the structure on all surface regions of the substrates was achieved.

During the coating, very high current densities could be reached at the substrates. With the same anode potential of $+40$ V, the current values were determined for a cathode current of 7.2 A, a cathode potential of $-560$ V and a substrate potential of $-60$ V. In dependency upon the strength of the magnetic field at the target (cf. also FIG. 6), the typical current densities at the substrates ranged between 1.0 and 1.5 mA/cm² substrate surface. During the coating, the argon pressure was at $6 \times 10^{-3}$ mbar and the nitrogen flow, which was added to the argon flow, was 27 sccm.

Figure 5:
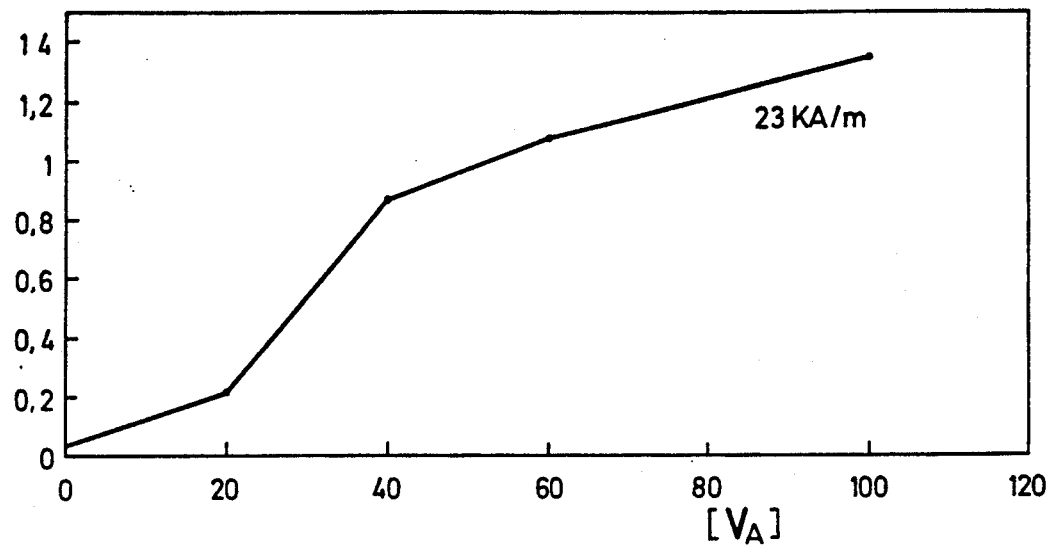
FIG. 5 is a diagram illustrating the dependency of the substrate current density $A_S$ upon the anode potential $V_A$.

FIG. 5 illustrates the effect of an anode voltage change on the current density $A_S$ at the substrates. It was hence possible to control the substrate current by selecting the anode potential.

FIG. 5 shows that, beginning with 0 V anode voltage and a low current density of 0.03 mA/cm² substrate surface, it was possible to obtain a current density of 1.1 mA/cm² by increasing the anode voltage to 60 V and even a current density of 1.35 mA/cm² at an anode voltage of 100 V. When etching at a current density of 1.1 mA/cm² and coating with $CrN_X$ at a current density of 1.5 mA/cm² substrate surface, there is not only a sufficient adhesion of the layer but also a low friction coefficient of $\mu = 0.3$ (as compared to $\mu = 0.8$ in example 1). In the friction test with the aforesaid tribometer, the distance covered exceeded 55 m without any significant scratch occurring.

The scratch caused in the scratch test covered a long distance without a significant splintering of the coating at the lateral edges of the scratch. In the Rockwell test using the aforesaid hand tester, a bulging could be observed at the edge of the impression of the sphere. Likewise, there was of course a corresponding deformation of the coating. The radial cracks in the coating at a distance from the sphere impression, which were observed in the corresponding comparative experiments, did not occur.

An examination of the coating under an electron microscope showed that the coating exhibited a surface without microscopic roughening caused by a rugged column structure. This may account for the low friction coefficient of $\mu = 0.3$.

Figure 6:
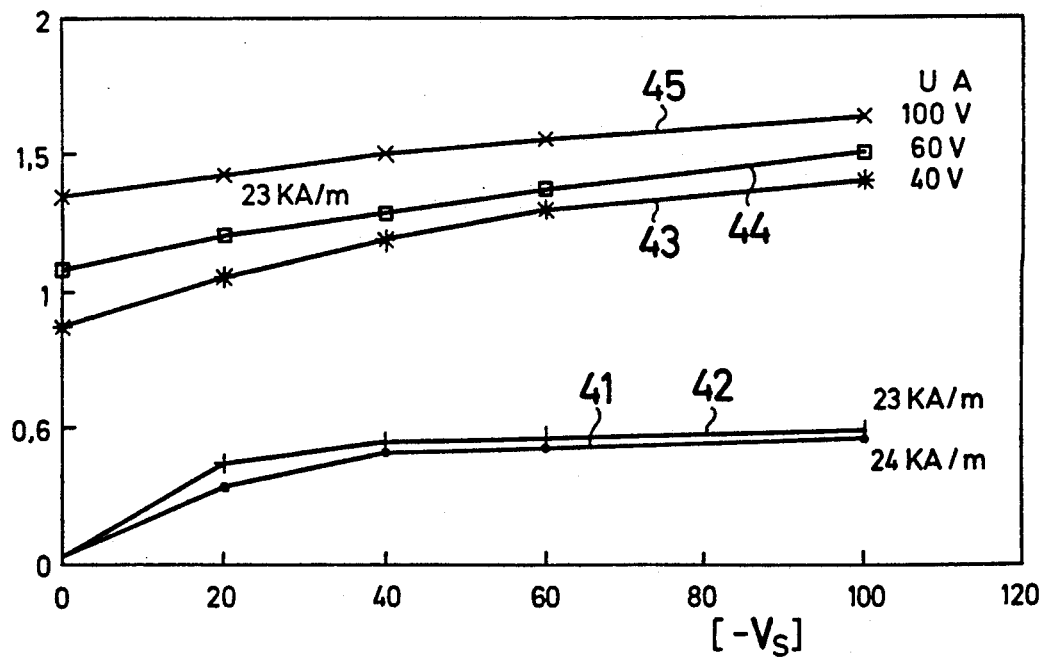
FIG. 6 is a diagram illustrating the dependency of the substrate current density $A_S$ upon the substrate potential in a comparative illustration for devices with and without elements of the inventions and FIG. 7 is a device in accordance with the invention corresponding to FIG. 2, however, the substrate and/or substrate holder are substantially larger.

FIG. 6 now convincingly shows the effect of the invention on the current density $A_S$ at the substrates in dependency upon the negative bias voltage at the substrate holder: The curves 41 and 42 illustrate the increase of the current density at the substrates for two different maximum horizontal components of the magnetic fields at the target surface (23 KA/m and 24 KA/m, respectively). For these values, the lowering of the field strength at the target surface has no positive effect on the current density at the substrates. Also, an increase of the negative bias voltage to over 40 V does not lead to a significant increase of the current density at the substrates exceeding 0.5 mA/cm² substrate surface.

The curves 43, 44 and 45 apply to the invention for the same magnetic field strength at the target surface (23 KA/m). The substrate current densities are already clearly higher, namely between approximately 0.8 and 1.3 mA/cm$^2$, for a bias voltage at the substrates $V_S$ of 0 V. An increase of the negative bias voltage of the substrate leads to a continuous increase of the substrate current density. In particular, an increase of the positive anode voltage $U_A$ from 40 to 100 V leads to a further pronounced increase of the current density at the substrates.

EXAMPLE 5

(Comparative Example)

In this example, the goal was to apply a titanium nitride coating (TiN$_X$) onto a large-sized component part i.e. a block with a square cross section and an edge length of 100 mm × 100 mm and a length of 300 mm.

Figure 7:
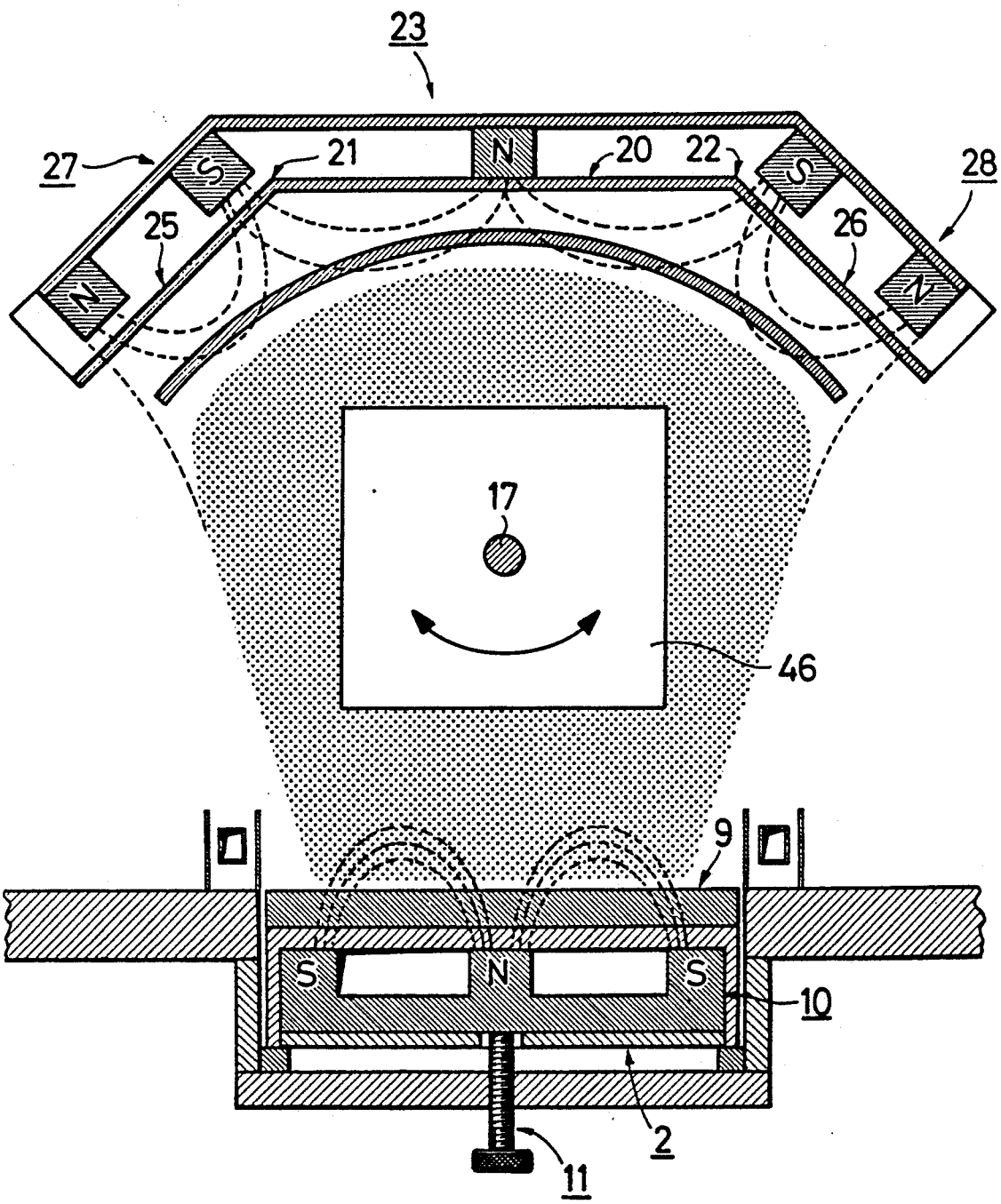

The device of FIG. 7 used for this purpose is distinguished from the one of FIG. 2 only in that the substrate (in a cross sectional view) has substantially greater dimensions.

This device was first operated under conditions analogous to those of FIG. 1, i.e. without a special anode and without the walls 20, 25 and 26 and the magnet arrangements disposed therebehind.

In order to be able to actually achieve a coating to be examined, a substrate voltage of −150 to 250 volts must be selected so as to obtain the current densities of 0.5 mA/cm$^2$ substrate surface, at a maximum. The layers then have the known gold-like character. However, the characteristic numbers subsequently listed in detail are critical for color and luster.

For the cathode this means that power densities between approximately 8 and 10 W/cm$^2$ target surface must be selected and a stoichiometric titanium nitride requires nitrogen flows between 35 and 40 sccm.

Consideration similar to those in the production of CrN$_X$ layers must taken into account for the preceding etching purification.

Yet, it is extremely difficult to produce adhesive layers on large preforms without supporting the etching process. Whereas, for decorative purposes, it was possible to precipitate titanium nitride layers of 0.25 to 0.5 μm, it was impossible to use the known device and process control of FIG. 1 to produce layers of a greater thickness for technical purposes, the thickness amounting to 2 μm (so called functional layers). Increasing layer thicknesses cause a gradually increasing internal stress in the coating which in turn caused layers of a greater thickness to peel off.

In addition, decorative layers are not exposed to the same kind of mechanical stress as functional layers.

At a substrate bias voltage of −200 V, a current density of 0.3 mA/cm$^2$ substrate surface, the substrate described above was covered with a golden TiN$_X$-layer. This layer exhibits a low brilliancy and is highly sensitive to handling. This high handling sensitivity can be described such that when the coating lacks sufficient density, it may absorb sweat and moisture, and finger prints or other traces caused by handling it may occur. Even when wiping such a spot with a dry cloth, the hand or finger print, due to the capillary effect of the layer, can no more be removed. Moreover, the characteristic color values necessary for a golden appearance are not obtained either.

The co called CIELAB-units, for which measuring methods and devices are described in literature, are essential for the characterization of optical properties of decorative surfaces. In the present case a color tester type "Color-EYE 1500S" manufactured by Macbeth was used for the measurements. The measurements were evaluated in so called L*-, a*- and b*-units. Unit L* denotes the brilliancy of the layer, with a positive a*-value describing the red value and a negative a*=-value the green value in the color. With respect to the b*-value, a positive value is a yellow shade and a negative b*-value is a blue shade. Typical values for a golden color shade are L*=89, a*=1.2 and b*=28, provided the light source C (catalog reference) is used for said measuring.

In the process described according to prior art, the following values were obtained:

L*=67
a*=3
b*=28.

These values indicate that a strong red coloring is obtained which, however, has a very unnatural appearance since the brilliancy L* of the layer is very low. In other words: What is obtained is a reddish, lackluster "golden coloring" which does not correspond to any gold standard. Layers of this kind cannot be used as decorative layers.

EXAMPLE 6

In a coating process with TiN$_X$, the device and arrangement of FIG. 7 were used to operate a magnetron cathode at a cathode potential of −500 V and a cathode current of 10 A. During the coating, a bias voltage of −120 V was applied to the substrate. At the same time, a potential of +40 V was selected at the anode. With these operating parameters, a substrate current of 2.6 A was measured at the substrate. For the aforesaid substrate dimensions, the calculated substrate current density is 2.2 mA/cm$_2$.

For the large preform, a dynamic condensing rate of 0.6 nm/sec was determined whereby a layer of a thickness of 0.35 μm was precipitated on the substrate after a coating time of 10 minutes. The process pressure selected by supplying argon amounted to $5 \times 10^{-3}$ mbar whereas in the gaseous atmosphere, a partial nitrogen pressure of $5 \times 10^{-4}$ could be determined after selecting a nitrogen flow of 35 sccm. The following CIELAB values were measured as optical values using the already mentioned color tester of Macbeth:

brilliancy: L*=77
red value: a*=0
yellow value b*=28

A layer having these characteristic values is certainly acceptable as a decorative gold layer since the coloring that was obtained corresponds to the Swiss Gold Standard 2N18.

With respect to the handling sensitivity, the experiment showed that only a minor coating of sweat and moisture was found on the surface after handling the layer. It could be wiped off with a cloth. The characteristic values were extremely uniform on the entire surface of the substrate.

Evaluation of examples 4 to 6

The chromium and CrN$_X$-layers produced with the device in accordance with the invention had the advantage that already the very low substrate potentials of some 10 Volts and the high current densities result in layers which can be used on technical component parts under tribologic operating conditions. This is particularly significant since in addition to the complicated geometry of such components, they also have a low rating due to high temperatures. Here too, the requirements diametrically oppose one another: on the on side, a high adhesiveness of the layers requires a process which is based on the ion-plating-effect, one the other side, the high thermal stress involved in such a process must be avoided.

In this connection, an essential possibility is reducing, at a high current density, the substrate potential from the −200 V largely used in conventional devices to a possible −50 V in accordance with the invention. This step drastically reduces the thermal stress of the substrates. Yet, the arrangement as a whole still permits ideal conditions for the growth of the layers.

The layers produced with the device of the invention are hence suitable for complicated preforms and component parts in all fields of machine construction, starting with ball bearing steel, cold working steel, low-alloy steel and including tool steel and hard metal.

The $TiN_x$ layers produced by means of the device according to the invention which are suitable for both decorative and technical purposes exhibit the following properties: as regards handling sensitivity and resistance to sweat and moisture, the layers in question rate very well. Layers of this kind can be used, for example, on articles of daily use like covers for lighters, writing utensils, watch casings and bracelets. An additional protective lacquer coating or any other protective measurement is not required. Moreover, the colors are substantially more uniform over the entire external surface of the coated component. The latter may have substantially larger dimensions than those coated with conventional devices.

Applications include both technical components and decorative objects. But also possible are functional applications such as the coating of tools made of cold working steel, high-performance highspeed steel and hard metal.

First additional experiments showed that the experience gathered with the $TiN_x$-coating of substrates can also analogously be applied to coatings made of $TiAlN_x$. Here too, the device in accordance with invention brings about significant advantages regarding process control and product properties.

We claim:

1. Device for coating substrates by means of cathode sputtering comprising
   a. a rectangular magnetron cathode which is provided with a target with longitudinal edges and defines a coating region, said cathode including a magnet system having poles,
   b. a substrate holder for substrates having rotated means and a rotating axis that is parallel to the longitudinal edges, whereby the substrates have surface elements which can be moved in the coating region on a circular path,
   c. a planar wall which has longitudinal edges and is made of a non-magnetic material, the edges also running parallel to the rotating axis of the substrate holder, including a magnet arrangement having poles, disposed behind the wall, for the generation of a longitudinally extended magnetic tunnel having longitudinal sides, this tunnel extending across the surface of the wall which faces the substrate, the magnetron cathode and the wall being on opposite sides of the rotating axis and the longitudinal sides of the magnetic tunnel also running parallel to the longitudinal edges of the target, and
   d. an anode between said planar wall and said substrate holder,
   e. characterized in that at least one additional wall 25, 26 having a respective at least one additional magnet system 27, 28 therebehind extends from a respective at least one longitudinal edge 21, 22 of said planar wall to an outer longitudinal edge 33, 34 which also parallels said rotating axis 17 at an angle which places said outer longitudinal edge of said additional wall closer to said target, as measured along a circular arc center on said rotating axis and extending from said respective at least one longitudinal edge of said planar wall toward said respective at least one longitudinal edge closes the circumferential distance, as seen from said axis, between said outer edge and said target, and in that
   f. the poles of the magnet system 10 and all the magnet arrangements 23, 27, 28 alternate on the circumference of the substrate holder such that the entire circumference of the substrate holder 16 is surrounded by an uninterrupted series of magnetic tunnels.

2. Device in accordance with claim 1, characterized in that the walls 20, 25, 26 of the magnet arrangements 23, 27, 28 are located on a polygonal enveloping surface which partly encloses the circular path and which is opposite the anode from the magnetron cathode 2.

3. Device in accordance with claim 1, characterized in that the polarity of the poles of the magnet system 10 of the magnetron cathode 2, these poles being parallel to the longitudinal edges 12, 13 of the target 9, is opposite to the respective polarity of those poles of the magnet system 27, 28 which are closest to the magnetron cathode.

4. Device in accordance with claim 3, characterized in that magnetic flux lines of a maximum field strength extend from the outer poles of the magnetron cathode 2 to the nearest poles of the magnet arrangement 27, 28 of the additional walls and do not intersect the substrate path.

5. Device in accordance with claim 4, characterized in that the minimum distance between the maximum-strength magnetic flux lines and the substrate path is dimensioned such that the plasma encloses the entire path covered by the substrates.

6. Device in accordance with claim 1, characterized in that the anode 30 is a curved electrode disposed between the substrate path and the magnet system opposite from the magnetron cathode.

* * * * *